US009792961B2

(12) United States Patent
Arora et al.

(10) Patent No.: US 9,792,961 B2
(45) Date of Patent: Oct. 17, 2017

(54) DISTRIBUTED COMPUTING WITH PHASE CHANGE MATERIAL THERMAL MANAGEMENT

(71) Applicants: Manish Arora, Dublin, CA (US); Nuwan Jayasena, Sunnyvale, CA (US); Gabriel H. Loh, Bellevue, WA (US); Michael J. Schulte, Austin, TX (US); Srilatha Manne, Portland, OR (US)

(72) Inventors: Manish Arora, Dublin, CA (US); Nuwan Jayasena, Sunnyvale, CA (US); Gabriel H. Loh, Bellevue, WA (US); Michael J. Schulte, Austin, TX (US); Srilatha Manne, Portland, OR (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 648 days.

(21) Appl. No.: 14/336,210

(22) Filed: Jul. 21, 2014

(65) Prior Publication Data

US 2016/0019937 A1    Jan. 21, 2016

(51) Int. Cl.
G06F 1/00    (2006.01)
G11C 7/04    (2006.01)
G11C 13/00   (2006.01)
G06F 1/20    (2006.01)

(52) U.S. Cl.
CPC .................. *G11C 7/04* (2013.01); *G06F 1/20* (2013.01); *G06F 1/206* (2013.01); *G11C 13/0004* (2013.01); *G11C 13/0061* (2013.01)

(58) Field of Classification Search
CPC ... G11C 13/0004; G11C 7/04; G11C 13/0061; G06F 1/206; G06F 1/20
See application file for complete search history.

(56) References Cited

U.S. PATENT DOCUMENTS

| 5,313,362 A | 5/1994 | Hatada et al. |
| 6,205,025 B1 | 3/2001 | Chen |
| 6,384,331 B1 | 5/2002 | Ku |
| 6,442,025 B2 | 8/2002 | Nakamura et al. |
| 6,535,798 B1 | 3/2003 | Bhatia et al. |
| 6,570,086 B1 | 5/2003 | Shimoji et al. |
| 6,636,910 B2 | 10/2003 | Kung et al. |
| 6,819,559 B1 | 11/2004 | Seeger et al. |

(Continued)

OTHER PUBLICATIONS

Walmart.com; *Cooler Master NotePal U2*, Black; http://www.walmart.com/ip/Cooler-Master-NotePal-U2-Black/15268203?findingMethod=rr; Sep. 12, 2012; pp. 1-2.

(Continued)

*Primary Examiner* — Xuxing Chen
(74) *Attorney, Agent, or Firm* — Timothy M. Honeycutt

(57) ABSTRACT

Various apparatus and methods using phase change materials are disclosed. In one aspect, a method of operating a computing device that has a first semiconductor chip with a first phase change material and a second semiconductor chip with a second phase change material is provided. The method includes determining if the first semiconductor chip phase change material has available thermal capacity. If the first semiconductor chip phase change material has available thermal capacity then the first semiconductor chip is instructed to operate in sprint mode. The first semiconductor chip is instructed to perform a first computing task while in sprint mode.

16 Claims, 8 Drawing Sheets

(56) References Cited

U.S. PATENT DOCUMENTS

| | | |
|---|---|---|
| 6,859,364 B2 | 2/2005 | Yuasa et al. |
| 6,980,418 B1 | 12/2005 | Seeger et al. |
| 7,623,349 B2 | 11/2009 | Refai-Ahmed et al. |
| 8,000,099 B2 | 8/2011 | Parker |
| 8,189,331 B2 | 5/2012 | Senatori |
| 8,379,383 B2 | 2/2013 | Sugiura et al. |
| 8,526,179 B2 | 9/2013 | Tracy et al. |
| 8,804,331 B2 | 8/2014 | Refai-Ahmed |
| 9,063,576 B1 | 6/2015 | Kaufman et al. |
| 2006/0193113 A1 | 8/2006 | Cohen et al. |
| 2008/0156003 A1* | 7/2008 | Mongia ............... F25B 25/00 62/79 |
| 2008/0158817 A1 | 7/2008 | Tsunoda et al. |
| 2010/0051243 A1 | 3/2010 | Ali et al. |
| 2011/0006190 A1 | 1/2011 | Alameh et al. |
| 2011/0178642 A1* | 7/2011 | Fujii ..................... G06F 1/206 713/323 |
| 2013/0050943 A1 | 2/2013 | Diep et al. |
| 2013/0235520 A1 | 9/2013 | Huang |
| 2013/0293844 A1 | 11/2013 | Gross et al. |
| 2014/0098486 A1 | 4/2014 | Davis |
| 2014/0267167 A1 | 9/2014 | Ricks |
| 2014/0317389 A1* | 10/2014 | Wenisch ................ G06F 1/20 712/229 |
| 2014/0358318 A1 | 12/2014 | Lin et al. |

OTHER PUBLICATIONS

Belkin; *Laptop Cooling Pad—Black*; http://www.bestbuy.com/site/Belkin+-+CoolSpot+Laptop+Cooling+Pad+-+Black/4635326.p?id=1218501938631&skuId=4635326; Sep. 12, 2012; pp. 1-2.
Sabrent; *Sabrent Laptop/Notebook Cooker Pad*; http://www.walmart.com/ip/15819378?adid=22222222227000675874&wmlspartner=wlpa&w10=&w11=g&w12=&w13=13692016750&w14=&w15=pla&veh=sem&veh=dat; Sep. 12, 2012; pp. 1-2.
Targus; *Targus—Chill Mat+—Black*; http://www.bestbuy.com/site/Targus+-+Chill+Mat%2B+-+Black/5570143.p?id=1218663134864&skuId=5570143; Sep. 12, 2012; pp. 1-2.
Motion Computing; *Motion™ LE1700 Tablet PC Quick Setup Brochure*; pp. 1-4; 2007.

* cited by examiner

DISTRIBUTED COMPUTING WITH PHASE CHANGE MATERIAL THERMAL MANAGEMENT

BACKGROUND OF THE INVENTION

1. Field of the Invention

This invention relates generally to electronic devices, and more particularly to structures and methods for providing thermal management of electronic devices while distributing computing tasks among semiconductor chips.

2. Description of the Related Art

Conventional schemes for thermally managing components of electronic devices normally entail placing some form of heat spreader in thermal contact with the component in question. A conventional heat spreader is typically constructed of some type of thermally conducting material and is often accompanied by some form of convective heat transfer. Some devices rely on natural convection. Others use forced convection through the usage of cooling fans. In some devices, liquid cooling schemes are used wherein a heat spreader is placed in contact with a component and a heat transfer fluid is mechanically pumped in a circuit that includes the heat spreader and some form of chiller. The chiller may simply involve a cooling fan and plurality of heat fins that are located remotely from the thermally managed component, but more complex systems may utilize refrigeration units.

Another conventional thermal management scheme involves the placement of a phase change material (PCM) in thermal contact with a heat producing semiconductor chip. The PCM absorbs heat while undergoing a phase change. During the phase change period, the PCM maintains a somewhat constant temperature. Conventional techniques have focused on a single semiconductor chip.

Typically, conventional semiconductor chips have a thermal design power or TDP. If a chip is operated by clocking or otherwise above its TDP for extended periods, eventual device failure is an expected outcome. However, it may be desirable to periodically operate a chip above its TDP for short bursts of activity. This technique is known as computational sprinting or sprint mode. Following a period of sprint mode, the chip must be allowed to cool below damaging temperature levels before another sprint is attempted. Conventional computational sprinting has focused on single chips.

The present invention is directed to overcoming or reducing the effects of one or more of the foregoing disadvantages.

SUMMARY OF EMBODIMENTS OF THE INVENTION

In accordance with one aspect of an embodiment of the present invention, a method of operating a computing device that has a first semiconductor chip with a first phase change material and a second semiconductor chip with a second phase change material is provided. The method includes determining if the first semiconductor chip phase change material has available thermal capacity. If the first semiconductor chip phase change material has available thermal capacity then the first semiconductor chip is instructed to operate in sprint mode. The first semiconductor chip is instructed to perform a first computing task while in sprint mode.

In accordance with another aspect of an embodiment of the present invention, a method of thermally managing a computing device that has a first semiconductor chip with a first phase change material and a second semiconductor chip with a second phase change material is provided. The method includes determining if the first semiconductor chip phase change material has available thermal capacity and if the second semiconductor chip material has available thermal capacity. The first semiconductor chip or the second semiconductor chip with available phase change material thermal capacity is instructed to perform a first computing task.

In accordance with another aspect of an embodiment of the present invention, a computing device is provided that includes a first semiconductor chip with a first phase change material and a second semiconductor chip with a second phase change material. A third semiconductor chip is programmed to determine if the first semiconductor chip phase change material has available thermal capacity and the second semiconductor chip phase change material has available thermal capacity and to instruct the first semiconductor chip or the second semiconductor chip having available thermal capacity to perform a first computing task.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Computing devices utilizing semiconductor chips fitted with phase change material (PCM) for thermal management are disclosed. The phase change material readily absorbs and stores heat during phase change and thus facilitates heat management for the circuit board and/or components mounted thereon. A task scheduler, such as a processor or other type of device, selectively routes computing tasks to those semiconductor chips that have PCM with available thermal capacity. The tasked semiconductor chips can be instructed to operate in sprint mode based on available PCM thermal capacity and the sensed need for sprint mode. Additional details will now be described.

Figure 1:
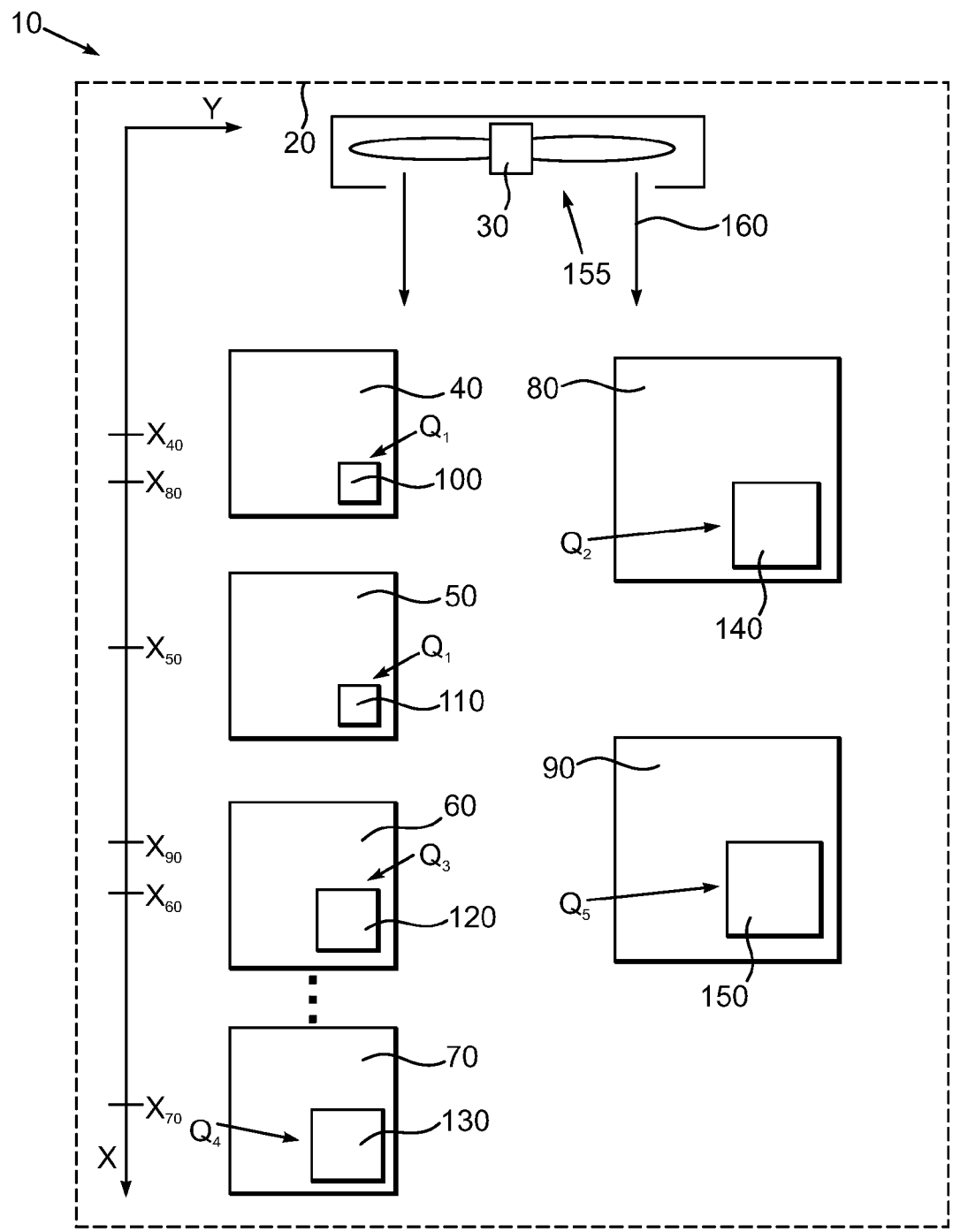
FIG. 1 is a schematic view of an exemplary embodiment of a computing device.

In the drawings described below, reference numerals are generally repeated where identical elements appear in more than one figure. Turning now to the drawings, and in particular to FIG. 1, therein is shown a schematic view of an exemplary embodiment of a computing device 10 that may include some type of enclosure 20, which houses, among other things, some type of cooling device 30 which may be a fan or other air movement device or multiple examples of such devices. In addition, the computing device 10 may include plural semiconductor chips, a few of which are shown and labeled 40, 50, 60, 70, 80 and 90, respectively. The chips 40, 50, 60, 70, 80 and 90 may be arranged in a myriad of spatial configurations. For example, the chips 40 and 80 may be positioned at locations $X_{40}$, $X_{80}$ along the X-axis, the chips 50 and 90 may be positioned at locations $X_{50}$ and $X_{90}$ and the chips 60 and 70 at positions $X_{60}$ and $X_{70}$. Furthermore, the chips 40, 50, 60, 70, 80 and 90 are provided with quantities $Q_1$, $Q_2$, $Q_3$, $Q_4$ and $Q_5$ of a PCM(s) 100, 110, 120, 130, 140 and 150. The thermal capacities of the PCMs 100, 110, 120, 130, 140 and 150 will depend, on among other things, on the quantities and types of the PCMs 100, 110, 120, 130, 140 and 150. Those chips that are closer to an outlet 155 of the cooling device 30, such as the chips 40, 50 and 80, may have some quantity of PCM that is proportional to their distance $X_{40}$, $X_{50}$ etc. from the cooling device 30. Thus, the chips 40 and 50 may have PCMs 100 and 110 of some quantity $Q_1$ and the PCM 140 of a chip 80 may have some quantity $Q_2$ while the PCM 120 of the chip 60 may have some quantity $Q_3$ and the PCM has some quantity $Q_4$ where $Q_3$ and $Q_4$ are proportionally larger than $Q_1$. Similarly, the PCM 150 for the chip 90 may have some quantity $Q_5$ which is proportionally larger than $Q_2$. The quantities $Q_1$, $Q_2$, etc. may be proportional to the temperature of the air 160 moved by the cooling device 30 and in turn proportional to the distance X along the X-axis from the outlet 155 of the cooling device 30. This arrangement of PCM quantity as a function of distance from the cooling device 30 need not be used in that all of the chips 40, 50, 60, 70, 80 and 90 may use the same quantity of a PCM. Of course, this chip 40 or that chip 90, etc., may use different types of PCMs and thus achieve the same result of a thermal capacity for a given chip that is proportional to its distance from the cooling device 30.

Figure 2:
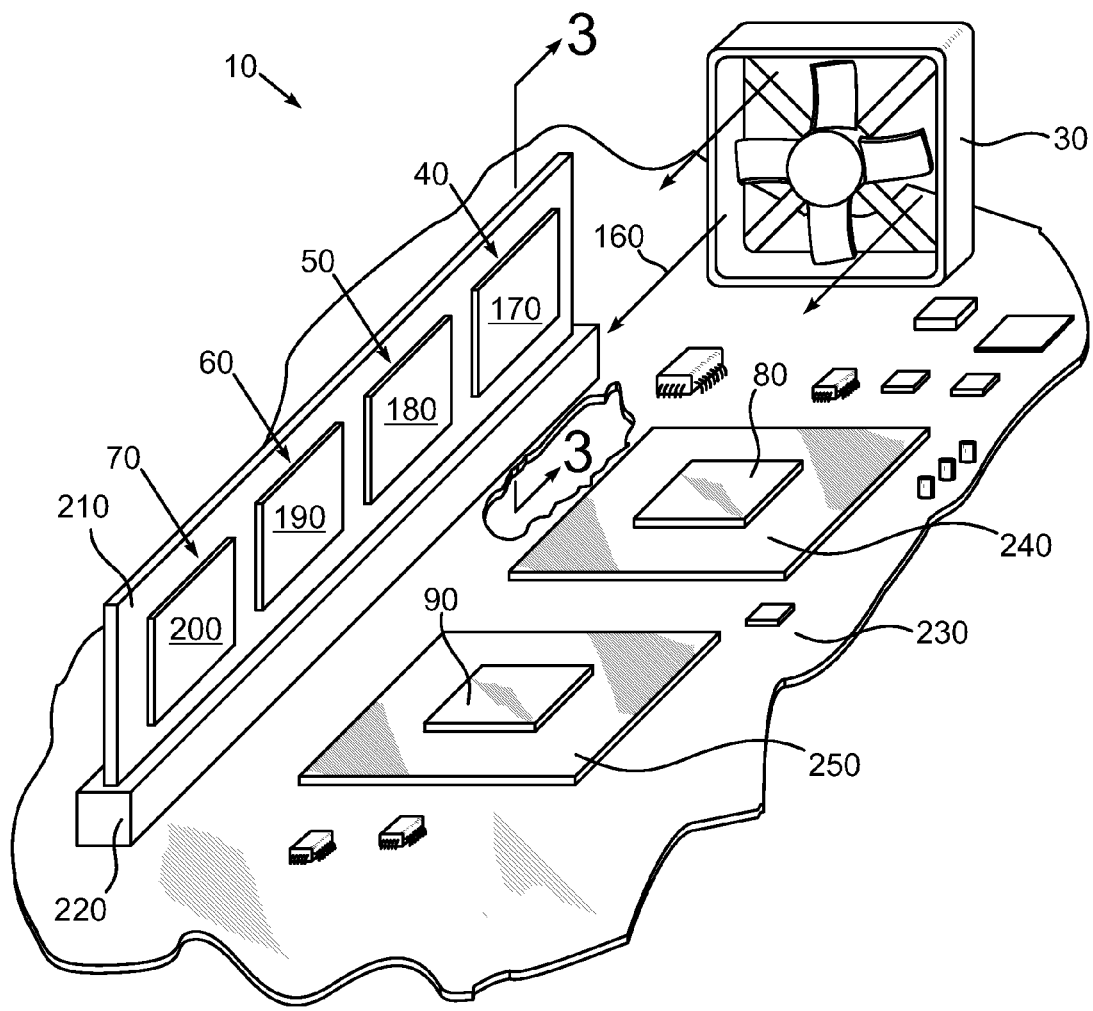
FIG. 2 is a pictorial view of a portion of an exemplary computing device.

The usage of PCMs 100, 110, 120, 130, 140 and 150 to provide thermal management is not dependent on the functionalities of the computing device 10 or the chips 40, 50, 60, 70, 80 and 90. Thus, the computing device 10 may be a computer, a digital television, a handheld mobile device, a personal computer, a server or virtually any type of electronic device that may benefit from thermal management. It should be understood that the semiconductor chips 40, 50, 60, 70, 80 and 90 may be microprocessors, graphics processors, combined microprocessor/graphics processors sometimes known as application or accelerated processing units, application specific integrated circuits, memory devices, systems on a chip, optical devices, passive components, interposers, or other devices and mounted to other devices, such as circuit boards as desired. For example, and as depicted in FIG. 2, which is a pictorial view of a small portion of the computing device 10, the chips 40, 50, 60 and 70 may be mounted in respective packages 170, 180, 190 and 200, which are in-turn mounted to a circuit or module board 210. The module board 210 may be mounted in a suitable socket 220 that is electrically connected to a system board 230. The semiconductor chips 80 and 90 may be mounted to respective semiconductor chip package substrates 240 and 250.

As heat is generated by the chips 40, 50, 60, 70, 80 and 90, the PCMs 100, 110, 120, 130, 140 and 150 will readily absorb and store heat while undergoing a change of physical phase, say from solid to liquid or from one solid phase to another. The heat can be released later during periods of reduced power consumption by the chips 40, 50, 60, 70, 80 and 90. The PCMs 100, 110, 120, 130, 140 and 150 and any alternatives thereof may be so-called solid-to-liquid phase materials or solid phase-to-solid phase materials. A large variety of different types of PCMs may be used. In general, there are three varieties of PCMs: (1) organic; (2) inorganic; and (3) eutectic. These categories may be further subdivided as follows:

TABLE 1

PCM MATERIAL CLASSIFICATION

| ORGANIC | INORGANIC | EUTECTIC |
|---|---|---|
| Paraffin | Salt Hydrate | Organic-Organic |
| Non-Paraffin | Metallic | Inorganic-Inorganic |
|  |  | Inorganic-Organic |

A variety of characteristics are desirable for the material(s) selected for the PCM 100, 110, 120, 130, 140 and 150 and any alternatives. A non-exhaustive list of the types of desired PCM characteristics includes a melting temperature $T_m$ less than but close to the maximum anticipated chip operating temperature $T_{max}$, a high latent heat of fusion, a high specific heat, a high thermal conductivity, small volume change and congruent melting (for solid-to-liquid), high nucleation rate to avoid supercooling, chemical stability, low or non-corrosive, low or no toxicity, nonflammability, nonexplosive and low cost/high availability. Some of these characteristics may be favored over others for a given PCM. Table 2 below illustrates some exemplary materials for the PCMs 100, 110, 120, 130, 140 and 150 and any alternatives.

TABLE 2

| Material | Melting Point $T_m$ (° C.) | Latent Heat of Fusion (kJ/kg) | Notes |
|---|---|---|---|
| Paraffin |  |  | The numbers in |
| 21 | 40.2 | 200 | the first column |
| 22 | 44.0 | 249 | represent the |
| 23 | 47.5 | 232 | number of carbon |
| 24 | 50.6 | 255 | atoms for a given |
| 25 | 49.4 | 238 | form of paraffin |
| 26 | 56.3 | 256 |  |
| 27 | 58.8 | 236 |  |
| 28 | 61.6 | 253 |  |
| 29 | 63.4 | 240 |  |
| 30 | 65.4 | 251 |  |
| 31 | 68.0 | 242 |  |
| 32 | 69.5 | 170 |  |
| 33 | 73.9 | 268 |  |
| 34 | 75.9 | 269 |  |
| Hydrocinnamic acid | 48.0 | 118 |  |
| Cetyl alcohol | 49.3 | 141 |  |
| α-Nepthylamine | 50.0 | 93 |  |
| Camphene | 50 | 238 |  |
| O-Nitroaniline | 50.0 | 93 |  |
| 9-Heptadecanone | 51 | 213 |  |
| Thymol | 51.5 | 115 |  |
| Methyl behenate | 52 | 234 |  |
| Diphenyl amine | 52.9 | 107 |  |
| p-Dichlorobenzene | 53.1 | 121 |  |
| Oxalate | 54.3 | 178 |  |
| Hypophosphoric acid | 55 | 21 |  |
| O-Xylene dichloride | 55.0 | 121 |  |
| β-Chloroacetic acid | 56.0 | 147 |  |
| Chloroacetic acid | 56 | 130 |  |
| Nitro naphthalene | 56.7 | 103 |  |
| Trimyristin | 33-57 | 201-213 |  |
| Heptaudecanoic acid | 60.6 | 189 |  |
| α-Chloroacetic acid | 61.2 | 130 |  |
| Bees wax | 61.8 | 177 |  |

TABLE 2-continued

| Material | Melting Point $T_m$ (° C.) | Latent Heat of Fusion (kJ/kg) | Notes |
|---|---|---|---|
| Glyolic acid | 63.0 | 109 | |
| p-Bromophenol | 63.5 | 86 | |
| Azobenzene | 67.1 | 121 | |
| Acrylic acid | 68.0 | 115 | |
| Dinto toluent (2,4) | 70.0 | 111 | |
| $Na_2HPO_4 \cdot 12H_2O$ | 40.0 | 279 | |
| $CoSO_4 \cdot 7H_2O$ | 40.7 | 170 | |
| $KF \cdot 2H_2O$ | 42 | 162 | |
| $MgI_2 \cdot 8H_2O$ | 42 | 133 | |
| $CaI_2 \cdot 6H_2O$ | 42 | 162 | |
| $K_2HPO_4 \cdot 7H_2O$ | 45.0 | 145 | |
| $Zn(NO_3)_2 \cdot 4H_2O$ | 45 | 110 | |
| $Mg(NO_3) \cdot 4H_2O$ | 47.0 | 142 | |
| $Ca(NO_3) \cdot 4H_2O$ | 47.0 | 153 | |
| $Fe(NO_3)_3 \cdot 9H_2O$ | 47 | 155 | |
| $Na_2SiO_3 \cdot 4H_2O$ | 48 | 168 | |
| $K_2HPO_4 \cdot 3H_2O$ | 48 | 99 | |
| $Na_2S_2O_3 \cdot 5H_2O$ | 48.5 | 210 | |
| $MgSO_4 \cdot 7H_2O$ | 48.5 | 202 | |
| $Ca(NO_3)_2 \cdot 3H_2O$ | 51 | 104 | |
| $Zn(NO_3)_2 \cdot 2H_2O$ | 55 | 68 | |
| $FeCl_3 \cdot 2H_2O$ | 56 | 90 | |
| $Ni(NO_3)_2 \cdot 6H_2O$ | 57.0 | 169 | |
| $MnCl_2 \cdot 4H_2O$ | 58.0 | 151 | |
| $MgCl_2 \cdot 4H_2O$ | 58.0 | 178 | |
| $CH_3COONa \cdot 3H_2O$ | 58.0 | 265 | |
| $Fe(NO_3)_2 \cdot 6H_2O$ | 60.5 | 126 | |
| $NaAl(SO_4)_2 \cdot 10H_2O$ | 61.0 | 181 | |
| $NaOH \cdot H_2O$ | 64.3 | 273 | |
| $Na_3PO_4 \cdot 12H_2O$ | 65.0 | 190 | |
| $LiCH_3COO \cdot 2H_2O$ | 70 | 150 | |
| $Al(NO_3)_2 \cdot 9H_2O$ | 72 | 155 | |
| $Ba(OH)_2 \cdot 8H_2O$ | 78 | 265 | |
| Eladic acid | 47 | 218 | |
| Lauric acid | 49 | 178 | |
| Pentadecanoic acid | 52.5 | 178 | |
| Tristearin | 56 | 191 | |
| Myristic acid | 58 | 199 | |
| Palmatic acid | 55 | 163 | |
| Stearic acid | 69.4 | 199 | |
| Gallium-gallium antimony eutectic | 29.8 | --- | The dashes indicate the value is unknown to the inventors at this time |
| Gallium | 30.0 | 80.3 | |
| Cerrolow eutectic | 58 | 90.9 | |
| Bi—Cd—In eutectic | 61 | 25 | |
| Cerrobend eutectic | 70 | 32.6 | |
| Bi—Pb—In eutectic | 70 | 29 | |
| Bi—In eutectic | 72 | 25 | |
| Bi—Pb-tin eutectic | 96 | --- | The dashes indicate the value is unknown to the inventors at this time |
| Bi—Pb eutectic | 125 | --- | The dashes indicate the value is unknown to the inventors at this time |

Figure 3:
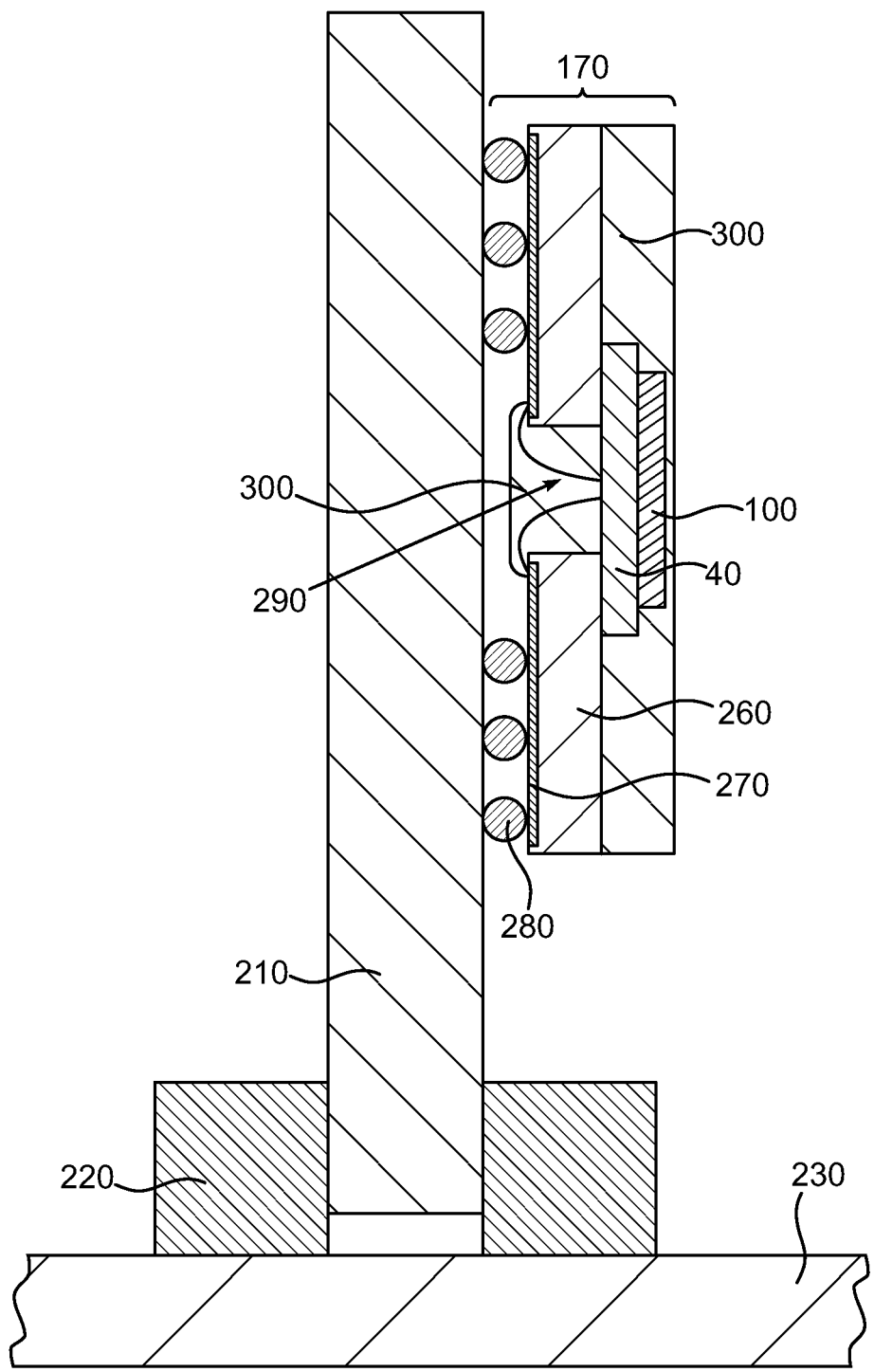
FIG. 3 is a sectional view of FIG. 2 taken at section 3-3.

Additional details of an exemplary embodiment of the package 170 may be understood by referring now also to FIG. 3, which is a sectional view of FIG. 2 taken at section 3-3. The following description of the package 170 will be illustrative of the other packages 180, 190 and 200. Note that section 3-3 passes through a portion of the system board 230, and the entirety of the circuit board 210, the package 170 and the socket 220. Although the package 170 can have a myriad of configurations, in this illustrative embodiment, the package 170 may be a flip-chip ball grid array package that includes a base substrate 260 upon which the semiconductor chip 40 is mounted. The substrate 260 includes bottom side metal interconnects 270 which are connected to an external ball grid array 280, which electrically connects to the circuit board 210. The semiconductor chip 40 is electrically connected to the interconnects 270 by way of plural bond wires 290. The semiconductor chip 40 is over molded with a molding material 300 that also covers the bond wires 290. However, the PCM 100 is positioned in a suitable pocket in the molding material 300. This may be accomplished in a variety of ways, such as by depositing the PCM 100 and then overmolding the material 300 or molding the material 300 up to a point where a suitable space is formed and then depositing the PCM therein and then finishing with an over molding over the PCM 100.

Figure 4:
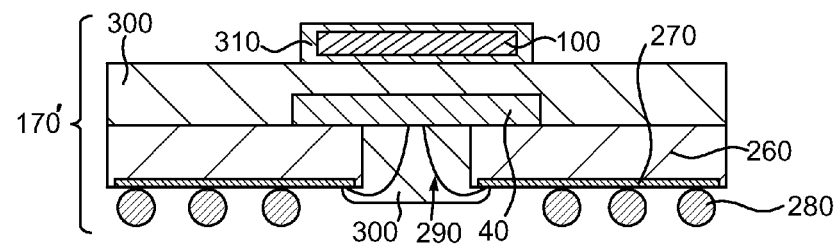
FIG. 4 is a sectional view like FIG. 3 but of an alternate exemplary packaged semiconductor chip device.

It should be understood that the configuration for the package 170 depicted in FIG. 3 represents just one of a myriad of different types of mounting schemes for a semiconductor chip. FIG. 4, is a sectional view like FIG. 3, but depicts an alternate exemplary embodiment of a package 170' removed from any larger circuit board or device. Like the aforementioned package 170, the package 170' that may include the substrate 260, the interconnects 270, the ball grid array 280, the bond wires 290 and the molding material 300 that encases the semiconductor chip 40. Here, however, the PCM 100 may be encased in an enclosure 310 which may be composed of well-known plastics or other polymer materials or even metals and is seated on the molding material 300.

Figure 5:
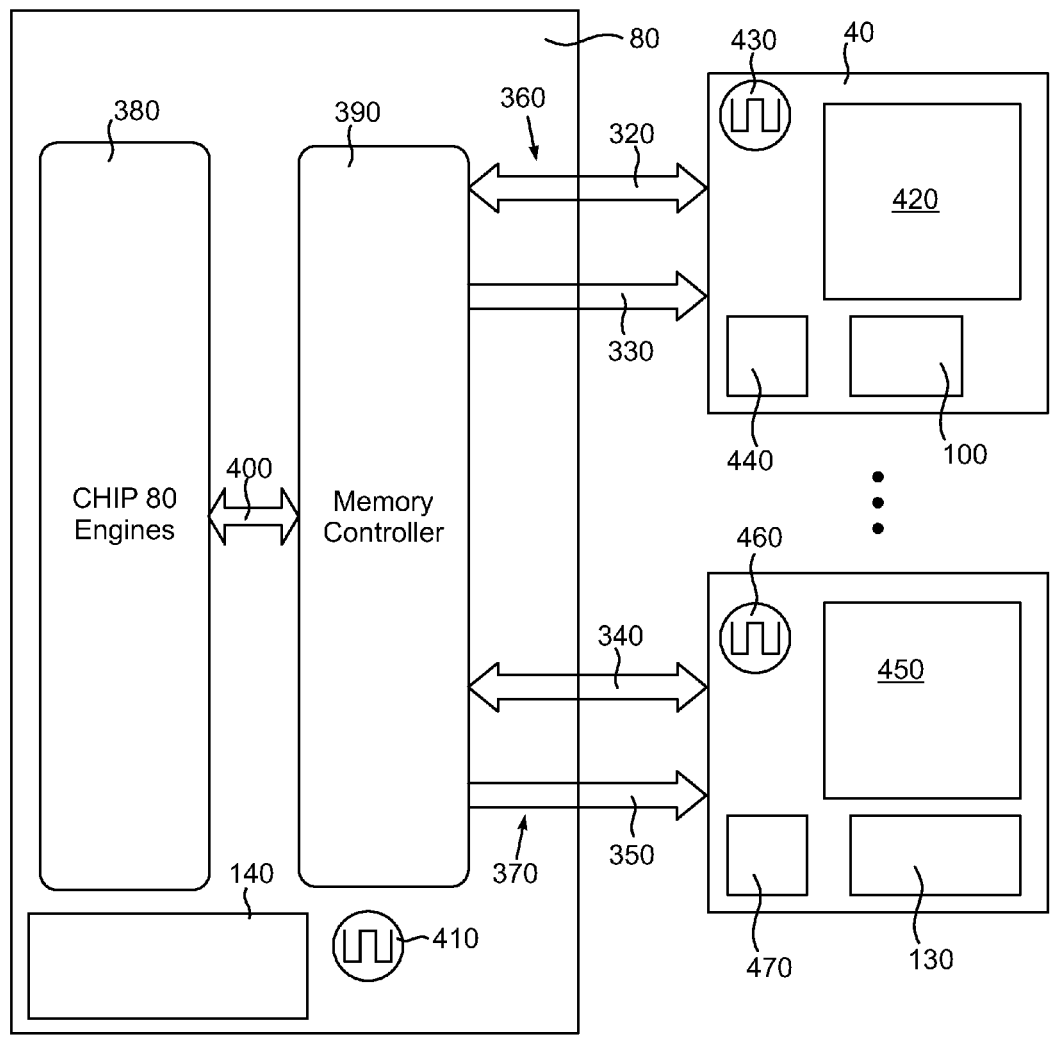
FIG. 5 is a schematic view of three exemplary semiconductor chips that include respective PCM portions.

Although the various semiconductor chips 40, 50, 60, 70, 80 and 90 depicted in FIGS. 1, 2, 3 and 4 may be virtually any type of integrated circuit, in an exemplary embodiment, the chips 40, 50, 60 and 70 may be memory devices and the chips 80 and 90 may be processors. For example, FIG. 5 depicts a schematic view depicting the chip 40, the chip 70 (with the ellipses there between indicating some optional number of additional chips as desired), the chip 80 and various data/clock channels between the chip 80 and the chips 40 to 70. The chips 40 . . . 70 herein may be alternatively termed the chips 40 to 70. For example, the semiconductor chip 80, equipped with the PCM 140, may communicate with the semiconductor chip 40 by way of a data bus 320 and a clock signal bus 330 and with the semiconductor chip 70 by way of a data bus 340 and a clock bus 350. The buses 320 and 330 may be organized into a data channel 360 and the buses 340 and 350 may be organized into another data channel 370. Of course it may be possible to have the chip 80 communicate with the chips 40 to 70 by way of a single data channel if desired.

As noted above, the chips 40, 70 and 80 may take on a variety of configurations. In this illustrative embodiment and in order to illustrate an exemplary communications, task scheduling and thermal management scheme, the chip 80 may be configured as a processor that includes one or more processor engines 380 and a memory controller 390 that is connected to the processor engines 380 by way of a bus 400. The chip 80 includes an internal clock 410, which may operate at a variety of frequencies. The memory controller 390 is logically connected to the chips 40 to 70 by way of the aforementioned data channels 360 and 370. In this illustrative embodiment, the chips 40 to 70 may be configured as memory devices. In this regard, the chip 40 may include a memory array 420, the PCM 100, a clock 430 and a temperature sensor 440. The chip 70 may similarly consist of a storage array 450, a clock 460, the PCM 130 and a temperature sensor 470. The memory controller 390 of the chip 80 is operable to send various commands for data storage and retrieval and other operations as well as clock signaling to the chips 40 to 70 by way of the aforementioned channels 360 and 370. For example, the memory controller 390 may be operable to instruct the chips 40 to 70 to run their respective clocks 430 and 460 at various frequencies that may be below or above some standard operating frequency. In addition, the memory controller 390 is operable to assign various tasks to the chips 40 to 70 based on a variety of different parameters that will be described in more detail below. The temperature sensors 440 and 470 are operable to sense a temperature of the chips 40 to 70 and those temperature readings may be delivered back to the chip 80 by way of the buses 320 and 340. In this way, the chip 80 can keep track of the thermal state of the chips 40 to 70 and thus make a determination as to how much thermal capacity for the respective PCMs 100 and 130 is available at any given moment in time. The thermal capacity of a PCM, e.g., the PCMs 100 and 130, is the amount of heat that may be absorbed by the PCM prior to undergoing complete phase change.

Figure 6:
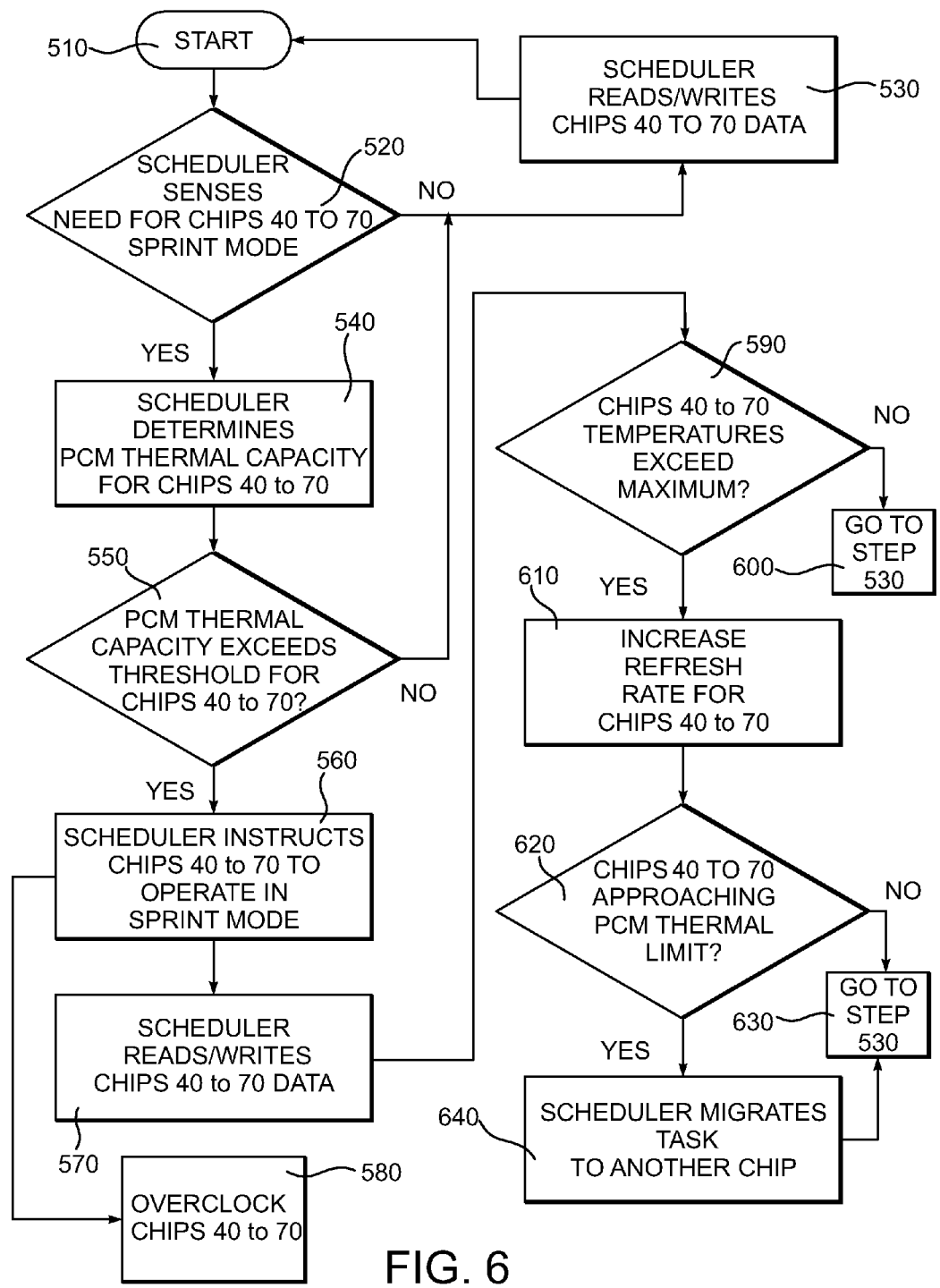
FIG. 6 is a schematic flow chart depicting an exemplary process flow for scheduling computing tasks to PCM enabled semiconductor chips.

An exemplary control scheme that selectively schedules tasks to be performed by multiple chips that include PCMs may be understood by referring now to FIGS. 5 and 6. FIG. 6 is a schematic flow chart depicting an exemplary process flow. In this illustrative process, a scheduler, which may be the chips 80 or 90, or some other device, is used to control scheduling of tasks to any or all of the chips 40 to 70 and various other operations. Hereinafter reference will be made to "chips 40 to 70" (or variations thereof). It is intended that various operations and measurements associated with such chips may be made individually, collectively or in various combinations. The instructions and steps described herein may be stored in a computer readable medium, which may be any kind of hard disk, optical storage disk, solid state storage device, ROM, RAM or virtually any other system for storing computer readable media. Memory device read/write operations are the illustrative scheduled tasks. The number of chips 40 to 70 can number less than or more than four, and could even be distributed in separate computing devices if desired. A device other than or in addition to the scheduler can direct task scheduling, and tasks other than or in addition to read/writes can be performed. The process flow starts at step 510. At step 520, the scheduler senses the desirability of sprint mode for any or all of the chips 40 to 70. In a sprint mode, the chips 40 to 70 can be operated individually or collectively (or in some other combination) in an environment that exceeds various normal parameters. For example, the frequency of the data buses 320 and 350 can be boosted, the chips 40 to 70 (individually or in various combinations) can be overclocked or otherwise operated above their thermal design power (TDP) budgets temporarily. Since the PCMs 100 and 130 can absorb heat without increasing temperature significantly, performance improvements over certain time intervals can be achieved. The durations of the time intervals depend on the amount PCM and the power profile of the chips 40 to 70. Such boosts in bandwidth may be coupled and enabled with changes on the scheduler side. The scheduler may choose to initiate sprint mode for the chips 40 to 70 during memory intensive periods where there is the possibility of the number of pending memory requests exceeding a certain threshold.

If at step 1020, the desirability for sprint mode is not detected, then at step 530, the scheduler reads/writes the chip 40 to 70 data. Conversely, if at step 520, the scheduler does sense the desirability for sprint mode for chips 40 to 70, then at step 540, the scheduler determines the PCM thermal capacity for the chips 40 to 70 (again, individually or in various combinations). This step may be performed in a variety of ways. For example, the scheduler may sense the number of operations that chips 40 to 70 have performed over some time interval and from those numbers make an estimate as to the remaining thermal capacity for the PCMs for chips 40 to 70. Alternatively, scheduler may obtain temperature data from, for example, the temperature sensors 440 and 470 shown in FIG. 5 (and others not shown) to use as a gauge for the remaining thermal capacity of the PCM for chips 40 to 70. A model may be generated for a given chip that is a function of the PCM quantity, for example, the quantities $Q_1$ and $Q_4$ depicted in FIG. 1, as well as the type of PCM and the size, type and functionality of the chips 40 to 70 that will provide an estimate of the PCM thermal capacities of the chips 40 to 70 under various circumstances. With the PCM thermal capacity for chips 40 to 70 in hand at step 550, the scheduler determines if the PCM thermal capacity for chips 40 to 70 exceed some threshold. If at step 550 the remaining PCM thermal capacity for chips 40 to 70 do not exceed some threshold, and therefore the chips 40 to 70 are not suitable candidates for sprint mode at that point in time, then the scheduler will go to step 530 and simply read/write the chips 40 to 70 data in normal mode. If, however, at step 550, the scheduler determines that the PCM thermal capacity for chips 40 to 70 exceeds some threshold, then the scheduler instructs chips 40 to 70 to operate in sprint mode at step 560. At step 570, scheduler read/writes the chips 40 to 70 data while chips 40 to 70 are in sprint mode. In parallel at step 560, the scheduler may, based on a determination that the PCM thermal capacities for chips 40 to 70 exceeds some threshold, proceed to step 580 and instruct chips 40 to 70 go into overclock mode. This may entail for example sending clock signals across the buses 330 and 350 shown in FIG. 5 to instruct the onboard clocks 430 and 460 to increase operating frequency.

Following step 570, various temperature readings may be performed. For example, at 590, it is determined whether temperatures of the chips 40 to 70 exceed some maximum. This may be a thermal design limit or some other maximum temperature associated with chips 40 to 70. The determination of whether temperatures of chips 40 to 70 exceed some maximum may be determined in a variety of ways such as by having the scheduler take data from the temperature sensors 440 and 470 of chips 40 to 70. If at step 1090 it is determined that temperatures of chips 40 to 70 do not exceed some maximum then at step 600 a return is made to step 530. Conversely, if it is determined at step 590 that the temperatures of chips 40 to 70 exceed some maximum then a variety of operations may take place. For example, at step 610, the chips 40 to 70 may be instructed to increase their respective refresh rates to compensate for leakage associated with elevated temperatures. The chips 40 to 70 might make this refresh rate change without input from the scheduler as well. At step 620, another assessment associated with temperature is made. Here, a determination is made if the chips 40 to 70 are approaching their respective PCM thermal limits. Again, this may be accomplished by having the scheduler examine the thermal data from the temperature sensors 440 and 470 shown in FIG. 5 or these assessments may be made onboard each of the chips 40 to 70. If at step 620 it is determined that the chips 40 to 70 are not approaching their respective PCM thermal limits, then at step 630 a return to step 1030 may be executed. Conversely, if it is determined at step 620 that the chips 40 to 70 are approaching their respective PCM thermal limits then the scheduler may migrate one or more operations to another chip(s). For example, if it is determined that the chip 40 is approaching its thermal limit, the scheduler may route the next instruction or set of instructions or tasks to the chip 50 or the chip 60 and so forth assuming that those particular chips 50 and 60 are not also approaching their respective thermal limits. In this way, sprint mode may be cycled among various chips. If the scheduler senses that migration is appropriate, then it or another chip can preemptively start prefetching or migrating data from the chip 40 currently sprinting to the next chip 50, 60 etc. that the process will be migrated to once the thermal limit on the chip 40 has been reached. In this manner, once the task has been migrated, the next chip 50, 60 etc. can execute it in sprint mode at near full-performance very quickly because the caches or other storage of or available to the chip 50, 60 etc. already have the necessary data prefetched. It may also be conceivable to migrate execution across different systems (e.g. over a network), if the energy and performance cost of migration are out-weighed by sprinting performance benefits. The above scheduling scheme could be implemented in software by providing the computing device 10 system software visibility into the necessary thermal information or in hardware schedulers that are available in certain types of processors (e.g. GPUs).

The following numerical example will illustrate the benefits of task scheduling in view of available chip PCM thermal capacity. Consider an example where the chips 40 to 70 of the computing device 10 number four (i.e., chips 40, 50, 60 and 70) and each of the chips 40, 50, 60 and 70, with the benefit of its particular PCM 100, 110, etc., can operate in sprint mode for 1 second but then has to wait for 24 seconds until the heat is expended and the PCM 100, 110 has full thermal capacity again. In this system there are four chips 40, 50, 60 and 70 where task execution could migrate. If all of the chips 40, 50, 60 and 70 have full thermal capacity at the outset of a time period, the computing device 10 can immediately impose sprint mode for at least 4 seconds. If the computing device 10 cycles through the four chips 40, 50, 60 and 70 and continuously loops migrations of tasks, it will be 3 seconds before execution would be scheduled back onto a chip. Assuming a linear gain in thermal capacity over time, the original chip, say chip 40, would have gained back (3/24)*100%=12.5% of its thermal capacity. This could enable a 125 millisecond sprint. This will continue for all the chips 40, 50, 60 and 70 so that sprint mode can last another (125 msec*4)=0.5 sec. Again during this time the dies gain thermal capacity by expending heat. This could again enable sprints of shorter durations (e.g. 84 msec the next time and so on). If the time performance cost of migration is discounted, the total sprint time is $4+4*3/24+(4*3/24)*3/24 \ldots = 4 (1+3/24+(3/24)^2+ \ldots )=4/(1-3/24)=4*24/21=4.57$ seconds. The sprint duration is 4.57 times the original 1 second duration when the PCM thermal capacities of the four chips 40, 50, 60 and 70 are used in this migration scheme, although this basic example does not account for migration overheads. But with increased system size, that is, larger number of available chips 40 to 70, there will be more opportunities for task migrations. For example, if the number of chips 40 to 70 is larger, on the order of say 25 or more each with a PCM 100, 110 etc., there should almost always be a chip with a full thermal capacity PCM.

Figure 7:
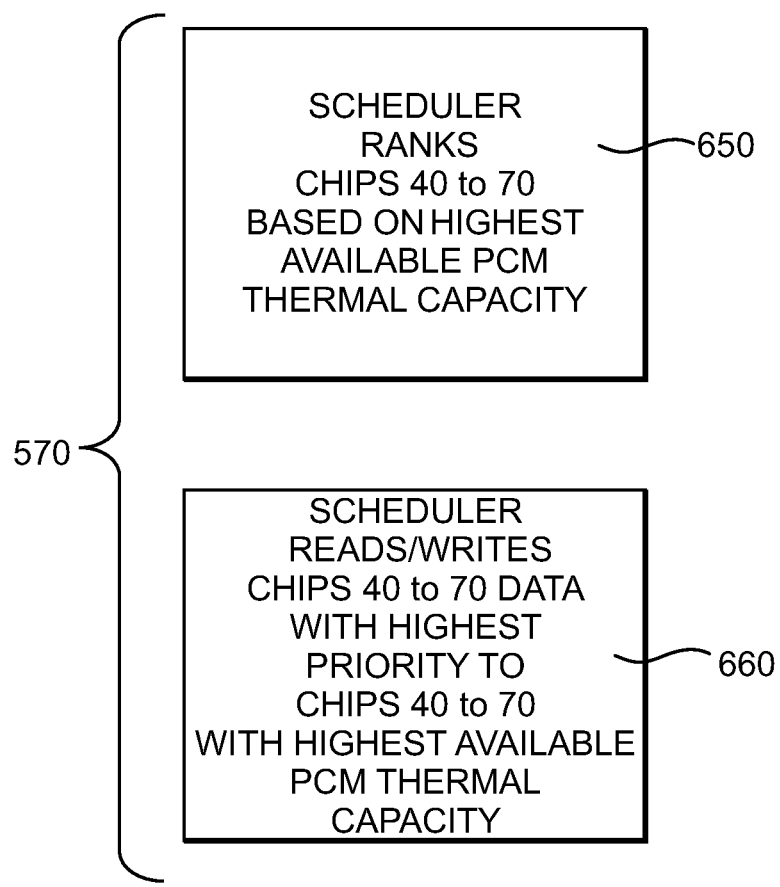
FIG. 7 is a schematic view depicting an alternate exemplary step from FIG. 6.

Step 570 illustrated in FIG. 6 may be accomplished in a variety of ways. FIG. 7 depicts a schematic view of a couple of alternatives for step 570. In the first alternative, step 570 may further include a step 650 where the scheduler ranks chips 40 to 70 based on which of those chips has the highest available thermal capacity. After the ranking, the scheduler may prioritize read/write or other tasks to those of chips 40 to 70 that have the highest available thermal capacity. In another alternative control scheme known colloquially as a "greedy mode" shown in FIG. 7, the scheduler may perform at step 660 read/write tasks of chips 40 to 70 data based on the relative importance of the particular task. The scheduler may determine that the particular task at hand has a higher priority then another type of operation and therefore assigns those high priority tasks to those chips 40 to 70 with the highest available PCM thermal capacity.

Figure 8:
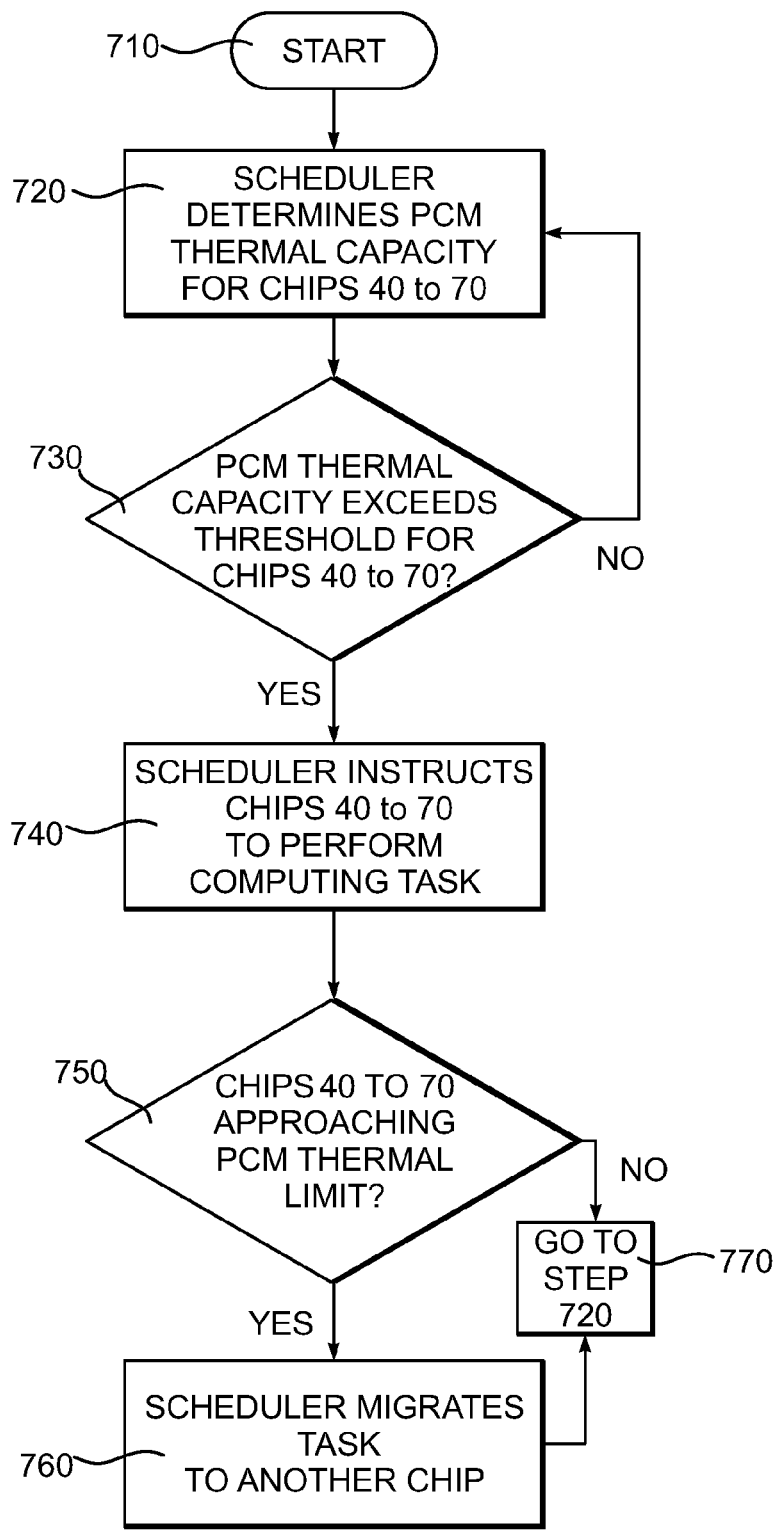
FIG. 8 is a schematic flow chart depicting an alternate exemplary process flow for scheduling tasks to PCM enabled chips.

FIG. 8 is a flow chart of an alternate exemplary task scheduling scheme that is somewhat more generalized than the sprint mode scheme depicted in FIGS. 6 and 7 described above. Here, the process flow starts at step 710, then proceeds to step 720 at which point the scheduler determines the PCM thermal capacity for chips 40 to 70. Next, a determination is made at step 730 if the PCM thermal capacity exceeds a threshold for chips 40 to 70. If at step 730 the PCM thermal capacity does not exceed a threshold then a return is made to step 720. Conversely, if at step 730 the PCM thermal capacity does exceed threshold, then at step 740 the scheduler instructs the chips 40 to 70 to perform a computing task. At step 750, another thermal measurement is made. Here, a determination is made as to whether chips 40 to 70 are approaching a PCM thermal limit. If at step 750 it is determined that the chips 40 to 70 are approaching a PCM thermal limit then at step 770 the scheduler migrates the computing task to another chip. Conversely if at step 750 the chips are not approaching a PCM thermal limit then a return is made to step 720 at step 770.

Figure 9:
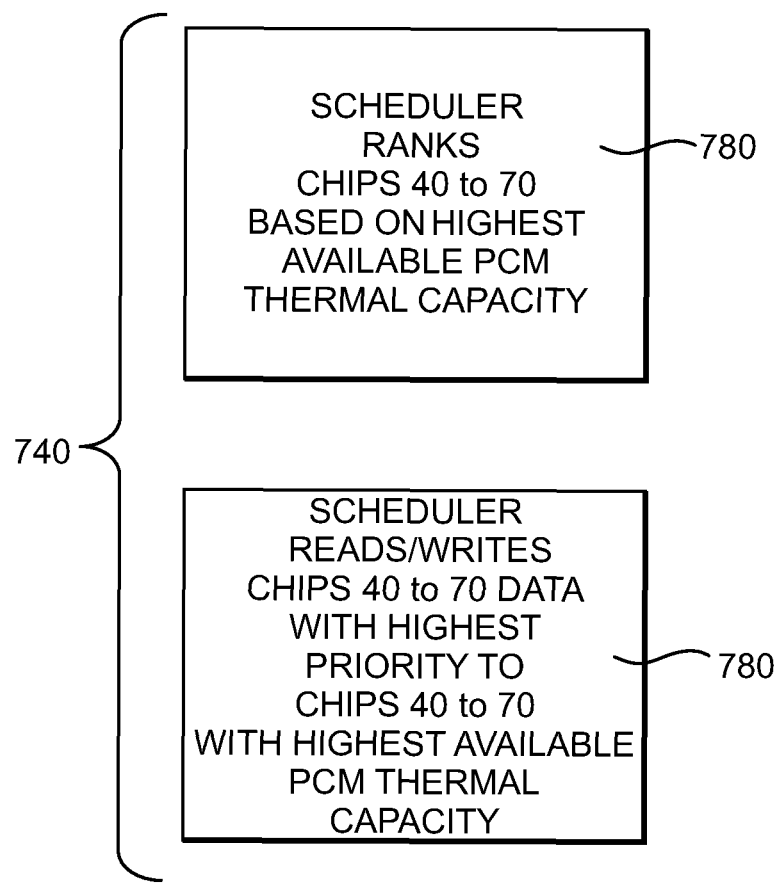
FIG. 9 is a schematic view depicting an alternate exemplary step from FIG. 8.

Step 720 illustrated in FIG. 8 may be accomplished in a variety of ways. FIG. 9 depicts a schematic view of a couple of alternatives for step 720. In the first alternative, step 720 may further include a step 780 where the scheduler ranks chips 40 to 70 based on which of those chips has the highest available thermal capacity. After the ranking, the scheduler may prioritize read/write or other tasks to those of chips 40 to 70 that have the highest available thermal capacity. In another alternative control scheme using greedy mode, the scheduler may perform at step 790 read/write tasks of chips 40 to 70 data based on the relative importance of the particular task. The scheduler may determine that the particular task at hand has a higher priority then another type of operation and therefore assigns those high priority tasks to those chips 40 to 70 with the highest available PCM thermal capacity.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of operating a computing device having first semiconductor chip including a first phase change material and a second semiconductor chip including a second phase change material, comprising:
   determining if the first semiconductor chip phase change material has available thermal capacity;
   if the first semiconductor chip phase change material has available thermal capacity then instructing the first semiconductor chip to operate in sprint mode;
   determining if the second semiconductor chip phase change material has available thermal capacity, and if so, then instructing the second semiconductor chip to operate in sprint mode; and
   ranking the first semiconductor chip and the second semiconductor chip based upon highest available thermal capacity and performing a computing task with the highest ranked of the first and second semiconductor chips.

2. The method of claim 1, performing another computing task with the lower ranked of the first and the second semiconductor chips.

3. The method of claim 1, comprising ranking the computing task and another computing task to be performed according to importance and instructing the highest ranked of the first and second semiconductor chips to perform the highest ranked computing task.

4. The method of claim 1, comprising determining if the first semiconductor chip phase change material is approaching a thermal limit, and if so, then migrating the computing task to the second semiconductor chip.

5. The method of claim 1, wherein the first and second semiconductor chips comprise memory devices, the method comprising using a processor to instruct the first semiconductor chip.

6. A method of thermally managing a computing device having first semiconductor chip including a first phase change material and a second semiconductor chip including a second phase change material, comprising:
   determining if the first semiconductor chip phase change material has available thermal capacity and if the second semiconductor chip material has available thermal capacity; and
   ranking the first semiconductor chip and the second semiconductor chip based upon highest available thermal capacity and performing a computing task with the highest ranked of the first and second semiconductor chips.

7. The method of claim 6, comprising ranking the first computing task and a second computing task to be performed according to importance and instructing the highest ranked of the first and second semiconductor chips to perform the highest ranked computing task.

8. The method of claim 6, comprising determining if the first semiconductor chip phase change material is approaching a thermal limit, and if so, then migrating the computing task to the second semiconductor chip.

9. The method of claim 6, wherein the first and second semiconductor chips comprise memory devices, the method comprising using a processor to instruct the first semiconductor chip and the second semiconductor chip.

10. A computing device, comprising:
    first semiconductor chip including a first phase change material and a second semiconductor chip including a second phase change material; and
    a third semiconductor chip programmed to determine if the first semiconductor chip phase change material has available thermal capacity and the second semiconductor chip phase change material has available thermal capacity and to instruct the first semiconductor chip or the second semiconductor chip having available thermal capacity to perform a first computing task; and
    wherein the third semiconductor chip is programmed to rank the first semiconductor chip and the second semiconductor chip based upon highest available thermal capacity and performing the first computing task with the highest ranked of the first and second semiconductor chips.

11. The computing device of claim 10, wherein the third semiconductor chip is programmed to instruct the first semiconductor chip or the second semiconductor chip having available thermal capacity to operate in sprint mode.

12. The computing device of claim 10, wherein the third semiconductor chip is programmed to migrate the first computing task to one of the first semiconductor chip and the second semiconductor chips that is further away from a thermal capacity limit.

13. The computing device of claim 10, wherein the third semiconductor chip is programmed to rank the first computing task and a second computing task to be performed according to importance and instructing the highest ranked of the first and second semiconductor chips to perform the highest ranked computing task.

14. The computing device of claim 10, wherein the first and second semiconductor chips comprise memory devices and the third semiconductor chip comprises a processor.

15. The computing device of claim 10, comprising a cooling fan with an air outlet, and wherein the first phase change material having a first maximum thermal capacity and the second phase change material having a second maximum thermal capacity.

16. The computing device of claim 15, wherein the first semiconductor chip or the second semiconductor chip with the lesser maximum phase change material thermal capacity is positioned closer to air outlet than the first semiconductor chip or the second semiconductor chip with the greater maximum phase change material thermal capacity.

\* \* \* \* \*